(12) United States Patent
Atokawa et al.

(10) Patent No.: US 6,351,195 B1
(45) Date of Patent: Feb. 26, 2002

(54) HIGH FREQUENCY CIRCUIT DEVICE, ANTENNA-SHARING DEVICE, AND COMMUNICATION APPARATUS HAVING SPACED APART GROUND ELECTRODES

(75) Inventors: Masayuki Atokawa; Nobuyoshi Honda, both of Kanazawa; Hajime Suemasa, Ishikawa-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/511,450

(22) Filed: Feb. 23, 2000

(30) Foreign Application Priority Data

Feb. 23, 1999 (JP) .......................................... 11-044470

(51) Int. Cl.[7] .............................................. H01P 1/202
(52) U.S. Cl. ...................... 333/134; 333/206; 333/202
(58) Field of Search ................................. 333/134, 206, 333/202, 207, 222, 12

(56) References Cited

U.S. PATENT DOCUMENTS

| | | | | |
|---|---|---|---|---|
| 4,879,533 A | * | 11/1989 | de Muro et al. ............ | 333/206 |
| 4,980,660 A | * | 12/1990 | Nakamura et al. ........... | 333/101 |
| 5,291,158 A | * | 3/1994 | Blair et al. .................. | 333/126 |
| 5,534,829 A | * | 7/1996 | Kobayashi et al. ..... | 333/134 X |
| 5,861,783 A | * | 1/1999 | Savicki ...................... | 333/12 X |
| 5,864,265 A | * | 1/1999 | Ballance et al. ............ | 333/206 |
| 6,023,202 A | * | 2/2000 | Hill ........................... | 333/12 X |

* cited by examiner

Primary Examiner—Robert Pascal
Assistant Examiner—Stephen E. Jones
(74) Attorney, Agent, or Firm—Ostrolenk, Faber, Gerb & Soffen, LLP

(57) ABSTRACT

In an antenna-sharing device, a transmission filter is electrically connected between a transmission terminal and an antenna terminal, and a reception filter is electrically connected between a reception terminal and the antenna terminal. A signal pattern and a ground electrode are formed on a resonator-mounting surface of a circuit substrate. On the ground electrodes, the resonators constituting the transmission filter are integrally soldered and the resonators constituting the reception filter are integrally soldered. On the mounting surface of the circuit substrate, a transmission filter ground electrode and a reception filter ground electrode are formed. Both ground electrodes are isolated from each other by a gap (slit), and are disconnected from each other.

9 Claims, 15 Drawing Sheets

HIGH FREQUENCY CIRCUIT DEVICE, ANTENNA-SHARING DEVICE, AND COMMUNICATION APPARATUS HAVING SPACED APART GROUND ELECTRODES

BACKGROUND OF THE INVENTION

1. Field of the Invention

The present invention relates to a high frequency circuit device for use in a microwave band, for example, an antenna-sharing device, and to a communication apparatus.

2. Description of the Related Art

High frequency circuit devices having a plurality of high frequency circuits formed on one circuit substrate have been known. One example is an antenna-sharing device in which a transmission filter and a reception filter, which are high frequency circuits, are mounted onto one circuit substrate. In this case, one ground electrode is provided substantially on the whole of the mounting surface (back side) of the circuit substrate excluding the area for a transmission terminal, an antenna terminal, and a reception terminal. This single ground electrode is common to the transmission filter and the reception filter.

Examplary portable telephone systems in which transmission and reception are simultaneously performed are analog systems, CDMA systems, or the like. An antenna-sharing device for use in these systems has a frequency characteristic (hereinafter, referred to as an isolation characteristic) such that a transmission signal is attenuated by a reception filter so that the transmission signal is prevented from strongly affecting a low noise amplifier or the like of a reception system circuit via the reception filter.

However, in the above described antenna-sharing device, the ground electrode is common to the transmission filter and the reception filter. Therefore, there are some cases where the ground current of the transmission filter and that of the reception filter electromagnetically interfere with each other in the ground electrode, and are coupled. When this electromagnetic coupling occurs, the isolation characteristics are deteriorated.

SUMMARY OF THE INVENTION

To overcome the above described problems, preferred embodiments of the present invention provide a high frequency circuit device, an antenna-sharing device, and a communication apparatus in which electromagnetic coupling between the ground currents of high frequency circuits can be inhibited.

One preferred embodiment of the present invention provides a high frequency circuit device comprising a plurality of high frequency circuits disposed on a single circuit substrate, ground electrodes of each of the plurality of high frequency circuits being disconnected from each other on the circuit substrate. More concretely, a ground electrode is disposed on the circuit substrate for each of the plurality of high frequency circuits. The ground electrodes are provided with a slit so as to be mutually isolated. As at least one of the plurality of high frequency circuits, for example, a filter comprising a coaxial dielectric resonator, an integrated-type dielectric filter, or a variable-frequency type filter having a voltage-controlled reactance element may be employed.

With above-described configuration, the ground currents of the respective high frequency circuits are inhibited from electromagnetically interfering with each other in the ground electrodes, and thereby, electromagnetic coupling between the ground currents of the high frequency circuits can be prevented.

Preferably, electronic components constituting the high frequency circuits are mounted onto the circuit substrate with a gap being provided between adjacent high frequency circuits, and the position of the slit provided between the ground electrodes overlaps the position of the gap provided between the high frequency circuits. Thereby, electromagnetic coupling of the ground currents, caused when the electronic components constituting the high frequency circuits come into contact with each other, can be prevented, an addition, electromagnetic coupling between the ground currents of the high frequency circuits in the ground electrodes can be prevented.

Also, preferably, shield covers are provided to correspond to each of the plurality of high frequency circuits, and the shield covers are connected to the ground electrodes independently of each other. Thereby, electromagnetic coupling between the ground currents of the high frequency circuits in the ground electrode can be prevented more effectively.

Preferably, in the high frequency circuit device of the present invention, at least two of the high frequency circuits have a common input-output terminal, and the portions in the vicinity of the common input-output terminal of the respective ground electrodes of the two high frequency circuits are electrically connected to each other by an electrically-connecting part.

In the case in which the ground electrodes of the respective plurality of high frequency circuits are disconnected from each other, grounding can be insufficient in some cases, depending on the shape and size of the ground electrode of a printed wiring substrate onto which the high frequency device is mounted, when the high frequency circuit device is built in practice in an electronic device such as a portable telephone or the like. In this case, sufficient grounding can be achieved by making predetermined portions of the plurality of ground electrodes conducting by an electrically-connecting part. Unwanted electromagnetic coupling between the ground currents of the high frequency circuits is substantially negligible, since the conduction is carried out only in a part of each ground electrode.

Further, in an antenna-sharing device and the communication apparatus according to the present invention, each are provided with the high frequency circuit device having the above-described characteristics. Accordingly, electromagnetic coupling between the ground currents of the high frequency circuits can be inhibited, and an excellent isolation characteristic can be attained.

Hereinafter, embodiments of a high frequency circuit device, an antenna-sharing device, and a communication apparatus according to the present invention will be described with reference with the attached drawings.

DESCRIPTION OF THE PREFERRED EMBODIMENTS

First Embodiment (FIGS. 1 through 7)

Figure 1:
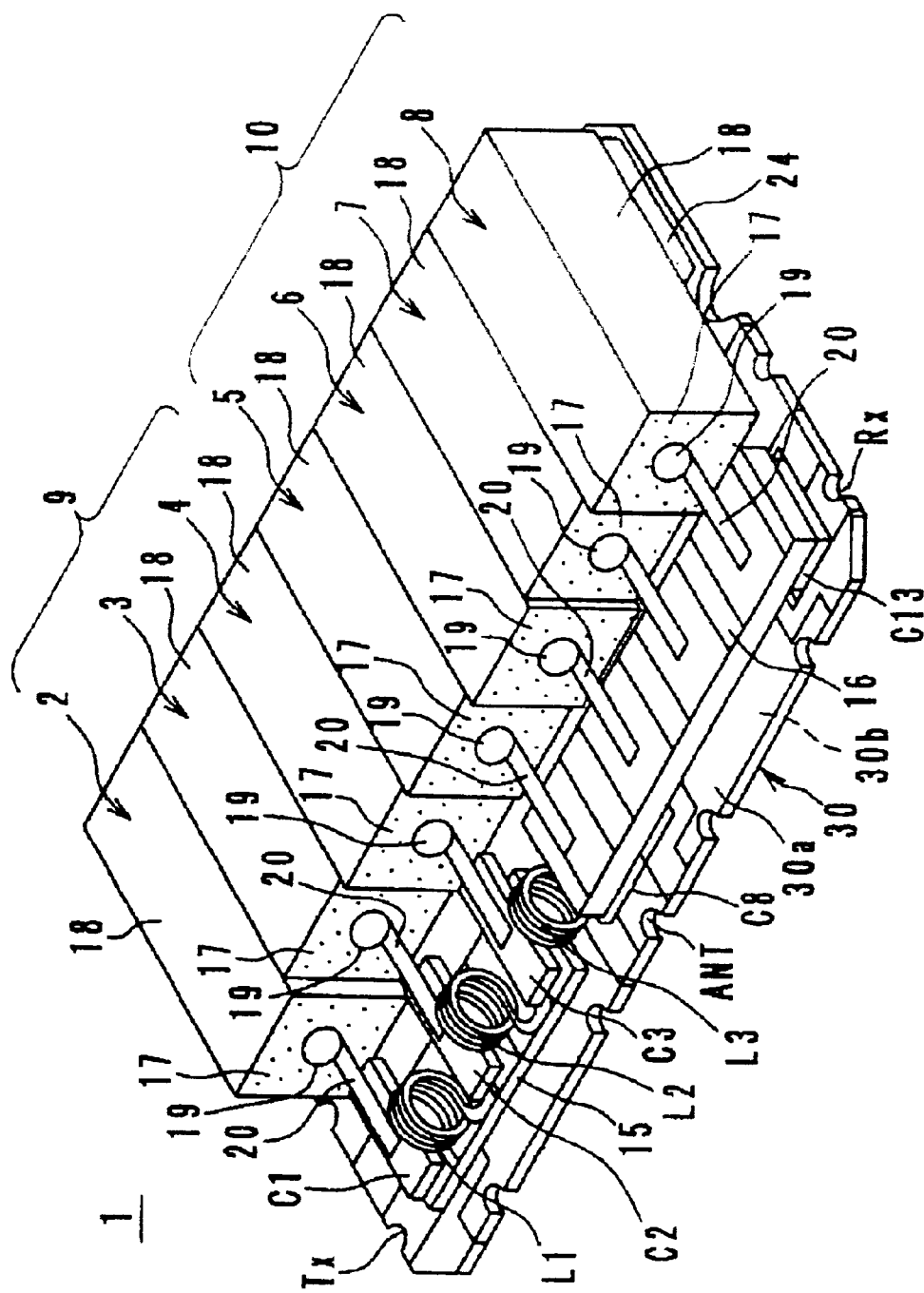
FIG. 1 is a perspective view showing the mounting structure of an antenna-sharing device according to a first embodiment of the present invention.

FIG. 1 is a perspective view showing an antenna-sharing device 1 having components mounted onto a circuit substrate 30. In the antenna-sharing device 1, a transmission filter 9 is electrically connected between a transmission terminal Tx and an antenna terminal ANT, while a reception filter 10 is electrically connected between a reception terminal Rx and the antenna terminal ANT. The antenna terminal ANT is an input-output terminal shared between the transmission filter 9 and the reception filter 10. The transmission filter 9 includes resonators 2,3, and 4, capacitors C1, C2, and C3, coils L1, L2, and L3, and a capacitor array substrate 15. Four capacitors C4 through C7 (see FIG. 2) are disposed on the capacitor array substrate 15. On the other hand, the reception filter 10 includes resonators 5,6, 7, and 8 capacitors C8 and C13, and a capacitor array substrate 16. Four capacitors C9 through C12 are disposed on the capacitor array substrate 16.

Figure 2:
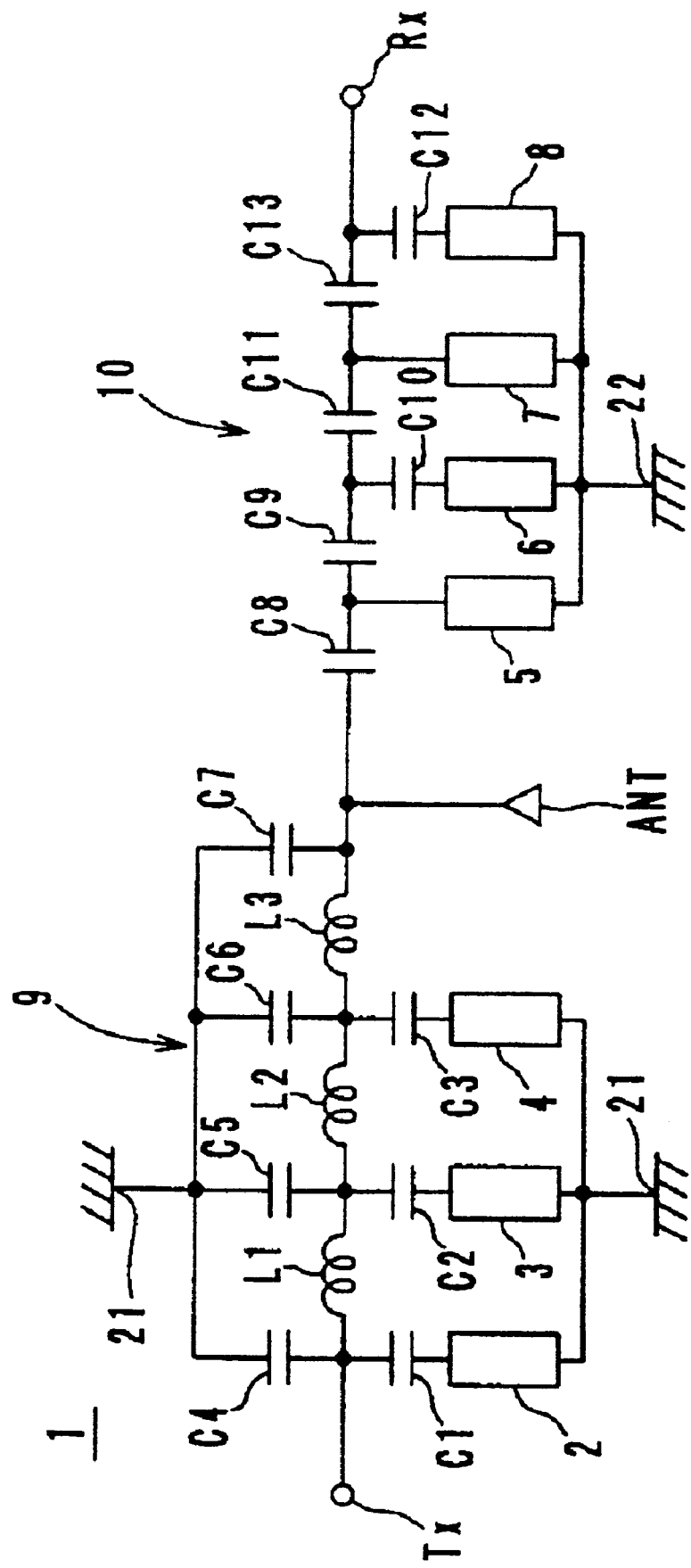
FIG. 2 is an electrical circuit diagram of the antenna-sharing device shown in FIG. 1.

FIG. 2 is an electrical circuit diagram of the antenna-sharing device 1. The transmission filter 9 is a band rejection filter comprising resonance circuits connected in three-stages. The resonator 2 is electrically connected to the transmission terminal Tx through the resonance capacitor C1. A series resonance circuit comprising the resonator 2 and the resonance capacitor C1, a series resonance circuit comprising the resonator 3 and the resonance capacitor C2, and a series resonance circuit comprising the resonator 4 and the resonance capacitor C3 are electrically connected to each other through the coupling coils L1 and L2. The capacitors C4, C5, and C6 are electrically connected in parallel to these three respective series resonance circuits. The antenna terminal ANT is electrically connected to a series resonance circuit comprising the resonator 4 and the resonance capacitor C3 through an L-shaped LC circuit comprising the coupling coil L3 and the capacitor C7. The resonance capacitors C1 through C3 determine the rejection-band attenuation.

The reception filter 10 is a band-pass filter comprising resonance circuits connected in four stages. The resonator 5 is electrically connected to the antenna terminal ANT through the coupling capacitor C8. A series resonance circuit comprising the resonator 5, the resonator 6, and the resonance capacitor C10 is electrically connected to a series resonance circuit comprising the resonator 7, the resonator 8, and the resonance capacitor C12 through the coupling capacitors C9, C11, and C13.

Figure 3:
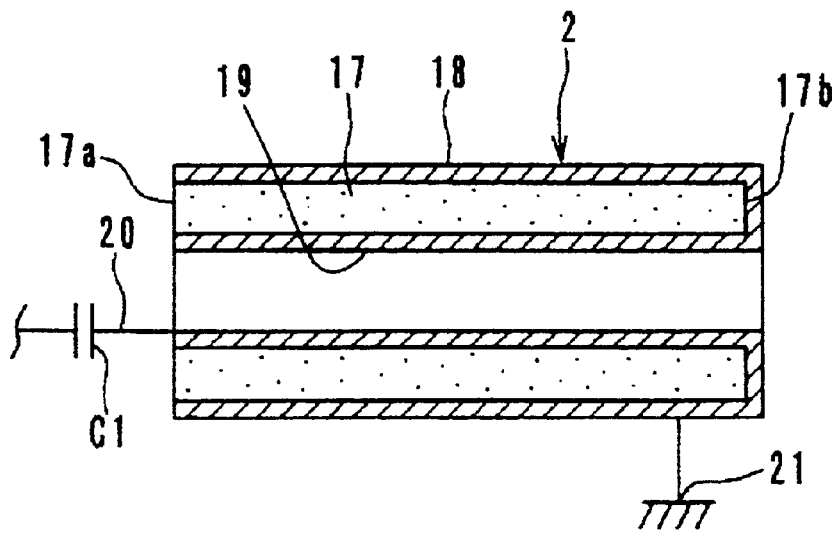
FIG. 3 is a cross-section showing an example of a resonator for use in the antenna-sharing device shown in FIG. 1.

Hereupon, as the resonators 2 through 8, $\lambda/4$ coaxial dielectric resonators are used, for example, as shown in FIG. 3. In FIG. 3, the resonator 2 is shown as a typical resonator. The dielectric resonators 2 through 8 each comprise a cylindrical dielectric 17 formed of a material with a high dielectric constant such as a $TiO_2$ type ceramic or the like, an outer conductor 18 provided on the outer peripheral surface of the cylindrical dielectric 17, and an inner conductor 19 provided on the inner wall of the cylindrical dielectric 17. The outer conductor 18 is electrically opened (separated) from the inner conductor 19 at an opening end-face 17a (hereinafter, referred to as an opening-side end-face 17a) on one side of the dielectric 17, and is electrically short-circuited (connected) to the inner conductor 19 at an opening end-face 17b (hereinafter, referred to as a short-circuiting-side end-face 17b) on the other side. The dielectric resonator 2 is electrically connected to the capacitor C1 through a conductor 20 at the opening-side end-face 17a. The outer conductors 18 of the respective dielectric resonators 2 through 4 are electrically connected to a transmission filter ground electrode 21 (described later). The outer conductors 18 of the respective dielectric resonators 5 through 8 are electrically connected to a reception filter ground electrode 22. These dielectric resonators 2 through 8 are soldered to each other at the outer conductors 18 thereof to be integrated.

Figure 4:
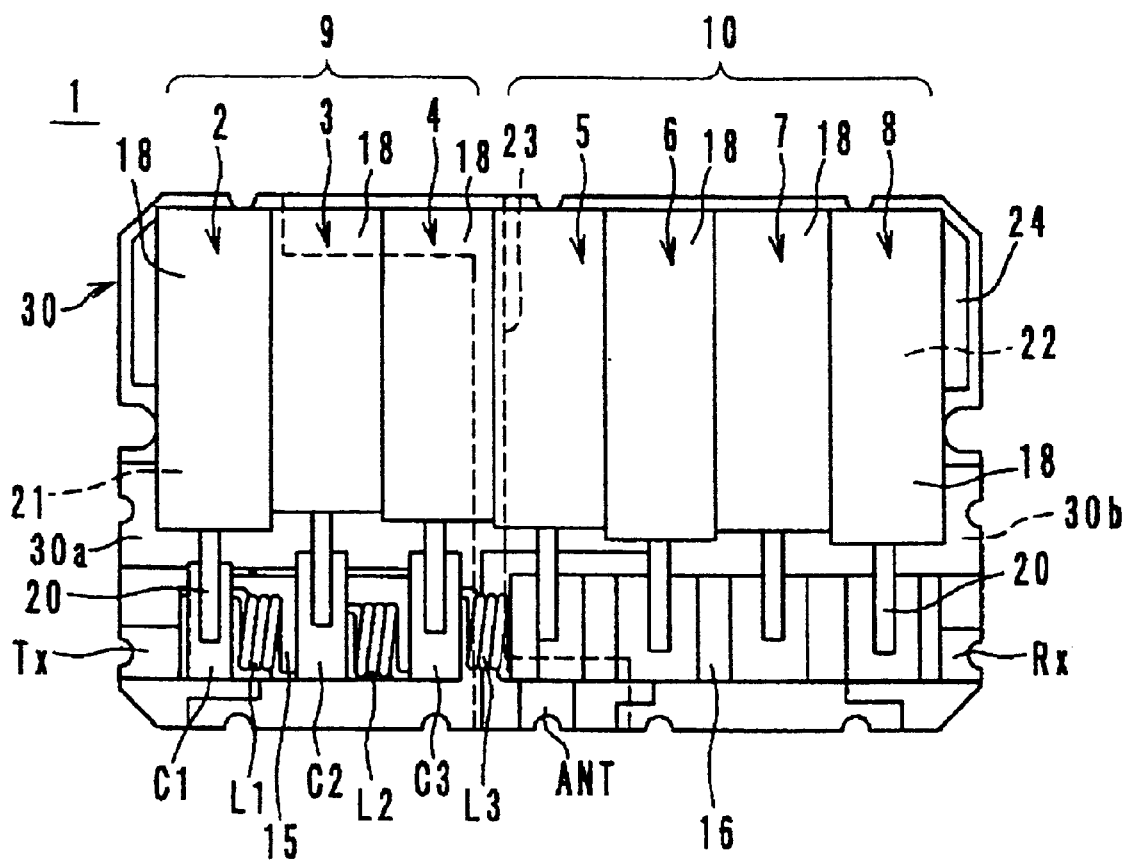
FIG. 4 is a plan view of the antenna-sharing device shown in FIG. 1.
Figure 5:
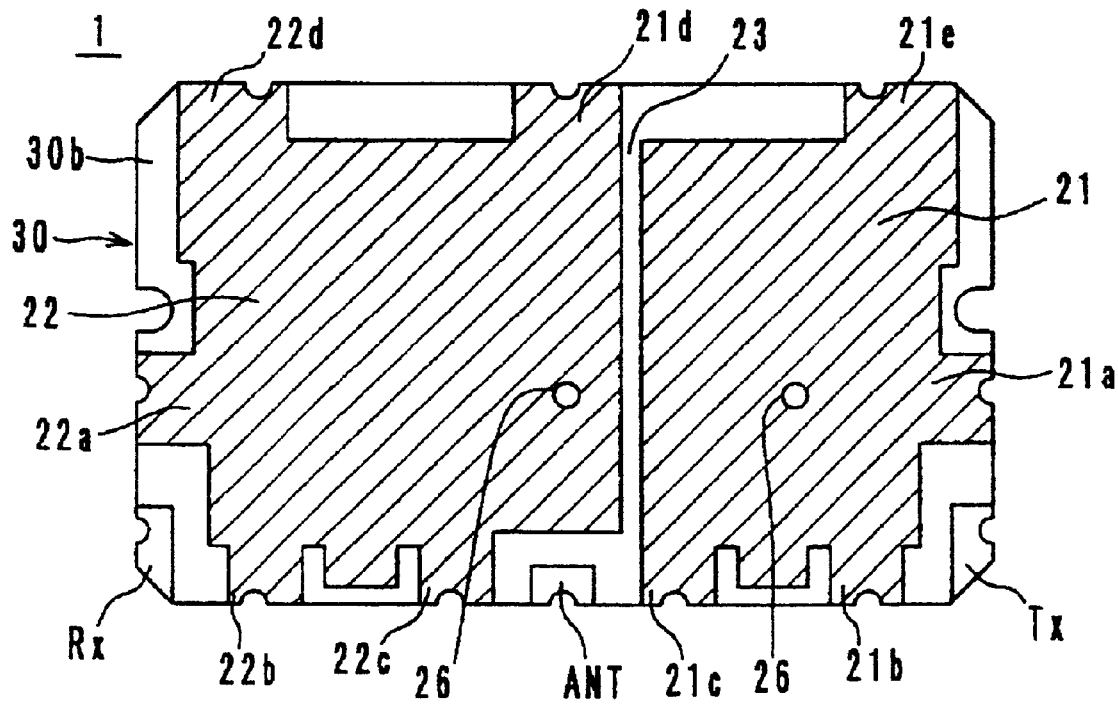
FIG. 5 is a plan view of a circuit substrate for use in the antenna-sharing device shown in FIG. 1, viewed from the mounting-surface side thereof.

The circuit substrate 30 is provided with the transmission terminal Tx, the antenna terminal ANT, and the reception terminal Rx in the edge portion thereof as shown in FIG. 1. A signal pattern and a ground electrode 24 are formed on a resonator-mounting surface 30a (the upper side in FIG. 1) side of the circuit substrate 30, as shown in FIG. 4. The ground electrode 24 occupies substantially half of the area of the resonator-mounting surface 30a. The resonators 2 through 8 are integrally soldered to the ground electrode 24. On the other hand, on a mounting surface 30b (the underside in FIG. 1) of the circuit substrate 30, the transmission filter ground electrode 21, and the reception filter ground electrode 22 (indicated by slanted lines) are formed as shown in FIG. 5. That is, the ground electrode 24 formed on the resonator-mounting surface 30a of the circuit substrate 30 is common to the transmission filter 9 and the reception filter 10. On the other hand, the ground electrodes 21 and 22 formed on the mounting surface 30b side are used exclusively for the transmission filter 9 and the reception filter 10, respectively. Through-holes 26 are provided as shown in FIG. 5.

The transmission filter ground electrode 21 and the reception filter ground electrode 22 formed on the mounting surface 30b of the circuit substrate 30 are mutually isolated by forming a gap (slit) 23, and they are disconnected from each other. The width of the gap 23 is set to be in the range of, for example, 0.2 to 1.0 mm. The longitudinal direction of the gap 23 is set to be parallel to that of the inner conductors 19 of the dielectric resonators 2 through 8. The gap 23 overlaps the position where the transmission filter 9 and the reception filter 10 are adjacent to each other (more concretely, at the position where the resonators 4 and 5 are adjacent to each other). The transmission filter ground electrode 21 is electrically connected to the ground electrode 24 formed on the resonator-mounting surface 30a by use of the through-holes 26 or by making end portions 21a through 21d bend onto the end-faces of the circuit substrate 30. Also, the reception filter ground electrode 22 is electrically connected to the ground electrode 24 by use of the through-holes 26 or by making the end portions 22a through 22e bend onto the end-faces of the circuit substrate 30.

In the antenna-sharing device 1 having the above-described configuration, a transmission signal entering the transmission terminal Tx from a transmission system circuit is output to the antenna terminal ANT via the transmission filter 9, while a reception signal received through the antenna terminal ANT is output from the reception terminal Rx to a reception system circuit via the reception filter 10.

Figure 6:
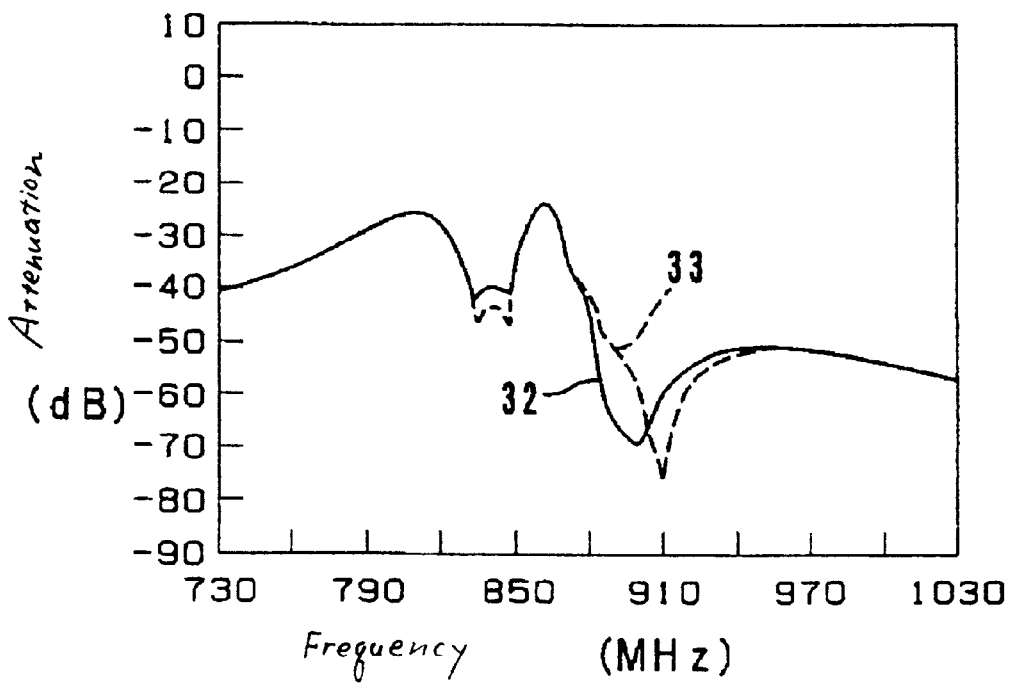
FIG. 6 is a graph showing the isolation characteristic of the antenna-sharing device shown in FIG. 1.

The transmission filter ground electrode 21 and the reception filter ground electrode 22 are disconnected from each other. Accordingly, the ground current of the transmission filter 9 and that of the reception filter 10 are electrically independent of each other on the mounting surface 30b of the circuit substrate 30. Thus, the ground currents of the filters 9 and 10 do not electromagnetically interfere with each other on the ground electrodes 21 and 22 on the mounting surface 30b of the circuit substrate 30, and electromagnetic coupling between the ground currents of the filters 9 and 10 can be inhibited. As a result, the antenna-sharing device 1 having an excellent isolation characteristic between the transmission terminal Tx and the reception terminal Rx can be obtained. FIG. 6 shows the isolation characteristic of the antenna-sharing device 1 (see the solid line 32). The isolation characteristic of a conventional antenna-sharing device (see the dotted line 33) is also illustrated for comparison, from which it is observed that the attenuation of a transmission signal in the reception filter of the antenna-sharing device is deteriorated.

Figure 7:
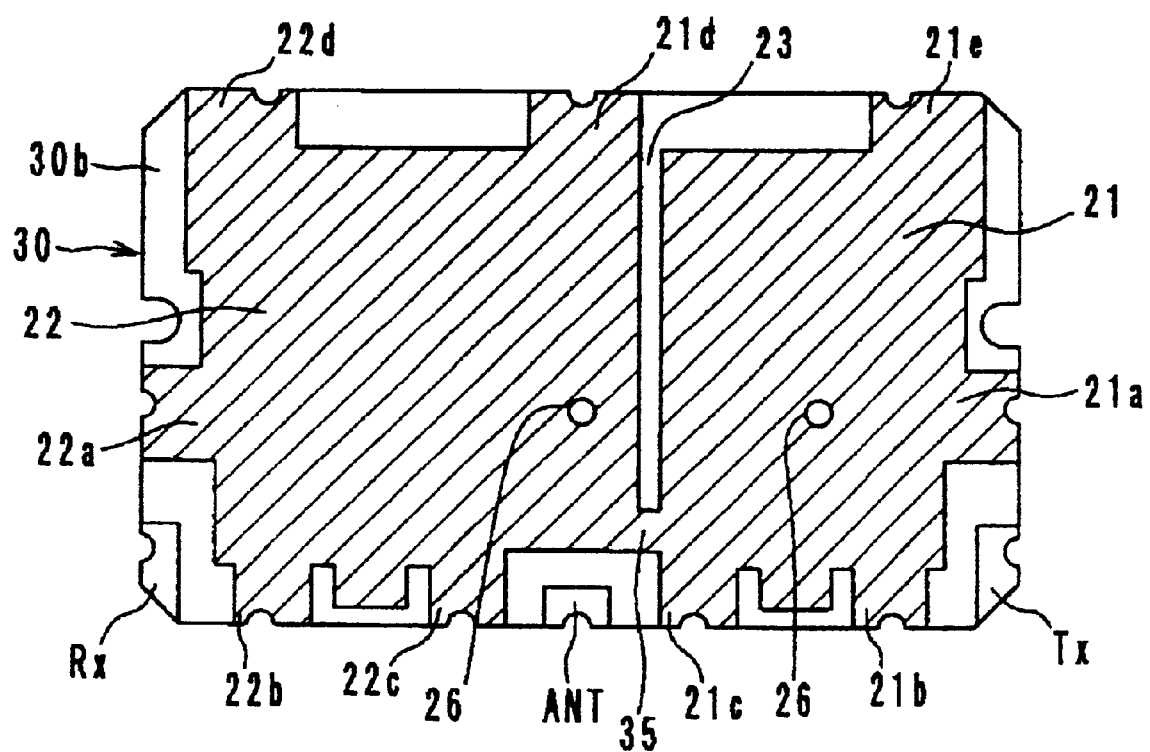
FIG. 7 is an illustration showing a modification example of the bottom of a circuit substrate for use in the antenna-sharing device shown in FIG. 1.

Further, in the case in which the transmission filter ground electrode 21 and the reception filter ground electrode 22 are disconnected from each other, the grounding sometimes becomes insufficient when the antenna-sharing device 1 is used in practice in a portable telephone or the like, depending on the shape and size of the ground electrode of a printed circuit board to which the antenna-sharing device 1 is mounted. Sufficient grounding can be achieved by electrically connecting the portions near to the antenna terminal ANT of the ground electrodes 21 and 22 through a conductor 35, as shown in FIG. 7. Since the conduction between the ground electrodes 21 and 22 is achieved only through a small part of each of them, unwanted electromagnetic coupling between the filters 9 and 10 through the conductor 35 is negligible.

Second Embodiment (FIGS. 8 through 11)

Figure 8:
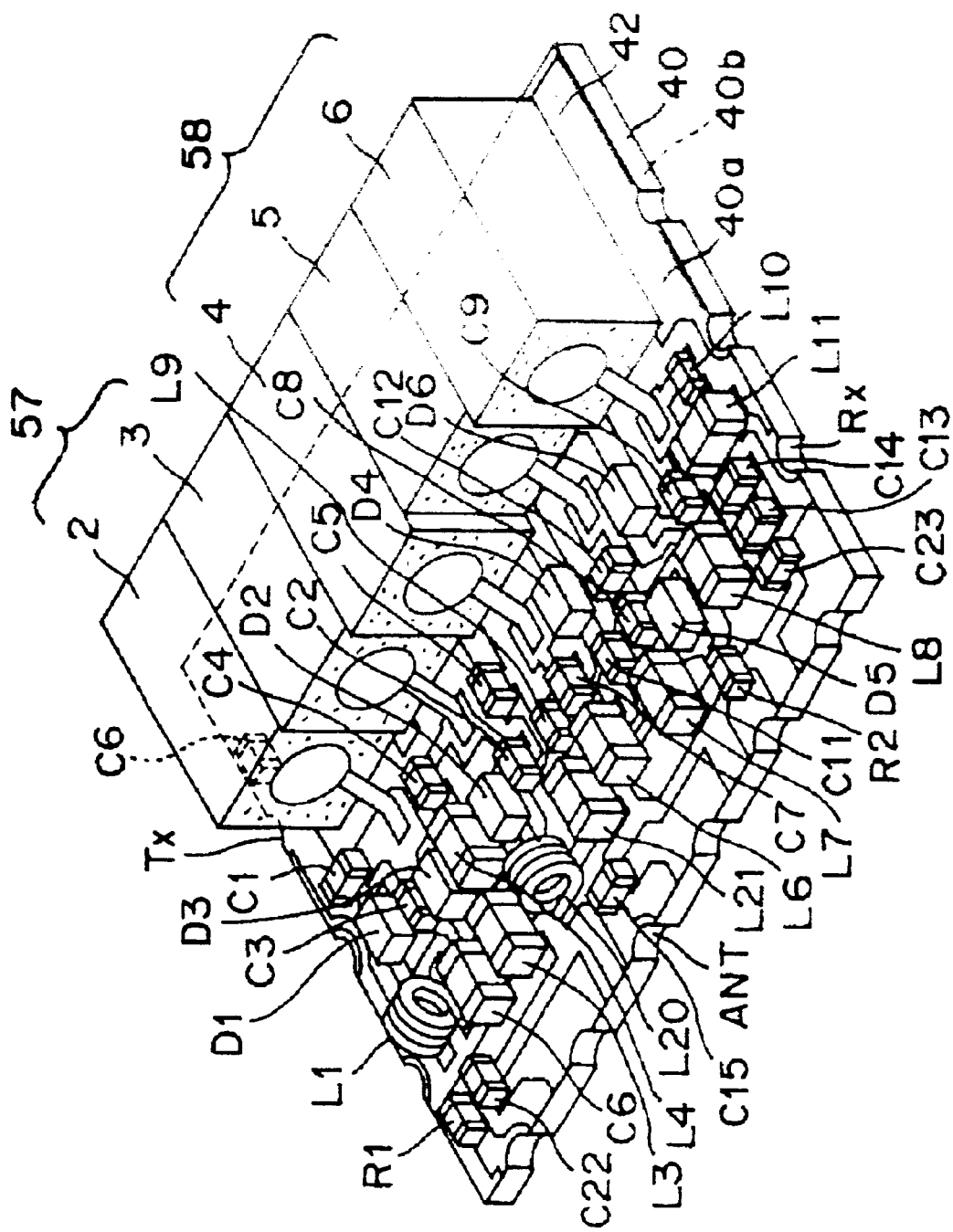
FIG. 8 is a perspective view of an antenna-sharing device according to a second embodiment of the present invention.

FIG. 8 is a perspective view of an antenna-sharing device 39 having components mounted onto a circuit substrate 40 thereof. In the antenna-sharing device 39, a transmission-side circuit 55 (see FIG. 9) is electrically connected between a transmission terminal Tx and an antenna terminal ANT, while a reception-side circuit 56 is electrically connected between a reception terminal Rx and the antenna terminal ANT.

Figure 9:
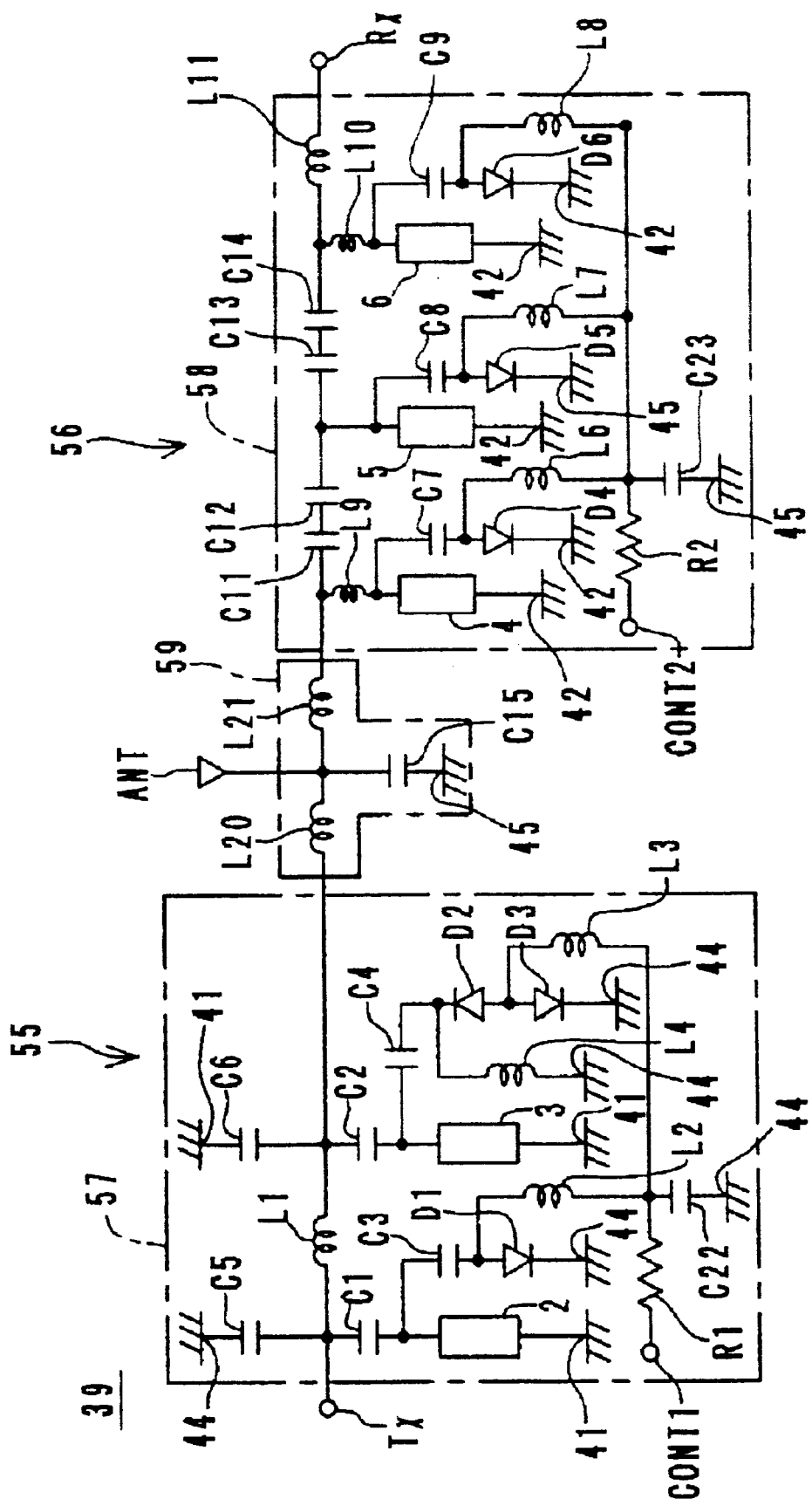
FIG. 9 is an electrical circuit diagram of the antenna-sharing device shown in FIG. 8.

FIG. 9 is an electrical circuit diagram of the antenna-sharing device 39. The transmission-side circuit 55 includes a variable-frequency band-rejection filter circuit 57 and a phase circuit 59. The variable-frequency band-rejection filter circuit 57 comprises resonance circuits connected in two stages, and includes a resonator 2 electrically connected to the transmission terminal Tx through a resonance capacitor C1, and a resonator 3 electrically connected to the phase circuit 59 through a resonance capacitor C2. The resonance capacitors C1 and C2 determine the rejection-band attenuation. The series resonance circuit comprising the resonator 2 and the resonance capacitor C1 is electrically connected to the series resonance circuit comprising the resonator 3 and the resonance capacitor C2 through a coupling coil L1. Further, capacitors C5 and C6 are electrically connected in parallel to these two series resonance circuits, respectively.

To an intermediate node between the resonator 2 and the resonance capacitor C1, a PIN diode D1, which is a reactance element, is electrically connected in parallel to the resonator 2 through a variable-band capacitor C3, with the cathode being connected to a transmission circuit ground electrode 44 (described later). On the other hand, to an intermediate node between the resonator 3 and the resonance capacitor C2, a series combination of two PIN diodes D2 and D3 is electrically connected in parallel to the resonator 3 through a variable-band capacitor C4. The cathode and the anode of the PIN diode D2 are electrically connected to the variable-band capacitor C4 and to the anode of the PIN diode D3, respectively. The cathode of the PIN diode D3 is connected to the transmission circuit ground electrode 44. The variable-band capacitors C3 and C4 are for changing the two attenuation pole frequencies of the attenuation characteristics of the variable-frequency band-rejection filter circuit 57. Further, a choke coil L4 is connected between the cathode of the PIN diode D2 and the transmission circuit ground electrode 44 so that a direct current flows when the PIN diodes D1 and D2 are turned on.

A voltage control terminal CONT1 is electrically connected to an intermediate node between the anode of the PIN diode D1 and the variable-band capacitor C3 via a control voltage supplying resistor R1, a capacitor C22, and a choke coil L2, and moreover, is electrically connected to an intermediate node between the anodes of the PIN diodes D2 and D3 via the control voltage supplying resistor R1, the capacitor C22, and a choke coil L3.

The phase circuit 59 is T-shaped and comprises a coil L20 electrically connected between the band rejection filter circuit 57 and the antenna terminal ANT, a capacitor C15 electrically connected between a reception circuit ground electrode 45 (described later) and the antenna terminal ANT, and a coil L21 electrically connected between a band-pass filter circuit 58 (described later) of the reception-side circuit 56 and the antenna terminal ANT.

On the other hand, the reception-side circuit 56 includes the variable-frequency band-pass filter circuit 58 and the phase circuit 59. In the second embodiment, the reception-side circuit 56 has the phase circuit 59 in common with the transmission-side circuit 55. Needless to say, the transmission-side circuit 55 and the reception-side circuit 56 may each have independent phase circuits.

The band-pass filter circuit 58 comprises resonance circuits connected in three stages, and includes a resonator 4 electrically connected to the phase circuit 59 through a resonance inductance L9, a resonator 6 electrically connected to the reception terminal Rx through a resonance inductance L10, and a resonator 5 electrically connected between the resonators 4 and 6 through coupling capacitors C11, C12, C13, and C14.

To an intermediate node between the resonator 4 and the resonance inductance L9, a series circuit comprising a variable-band capacitor C7 and a PIN diode D4 is electrically connected in parallel to the resonator 4 with the cathode of the PIN diode D4 being connected to a reception circuit ground electrode 42 (described later). To an intermediate node between the resonator 5 and the coupling capacitors C12 and C13, a series circuit comprising a variable-band capacitor C8 and a PIN diode D5 is electrically connected in parallel to the resonator 5 with the cathode of the PIN diode D5 being connected to the reception circuit ground electrode 45. To an intermediate node between the resonator 6 and the resonance inductance L10, a series circuit comprising a variable-band capacitor C9 and a PIN diode D6 is connected in parallel to the resonator 6 with the cathode of the PIN diode D6 being electrically connected to the reception circuit ground electrode 42.

A voltage control terminal CONT2 is electrically connected to an intermediate node between the anode of the PIN diode D4 and the variable-band capacitor C7 through a control voltage supplying resistor R2, a capacitor C23, and a choke coil L6, and is further electrically connected to an intermediate node between the anode of the PIN diode D6 and the variable-band capacitor C9 through the control voltage supplying resistor R2, the capacitor C23, and a choke coil L8.

Further, as the resonators 2 through 6, λ/4 coaxial dielectric resonators are used. The outer conductors of the dielectric resonators 2 and 3 are electrically connected to a transmission circuit ground electrode 41 (described later). The outside conductors of the dielectric resonators 4 through 6 are electrically connected to the reception circuit ground electrode 42.

Figure 10:
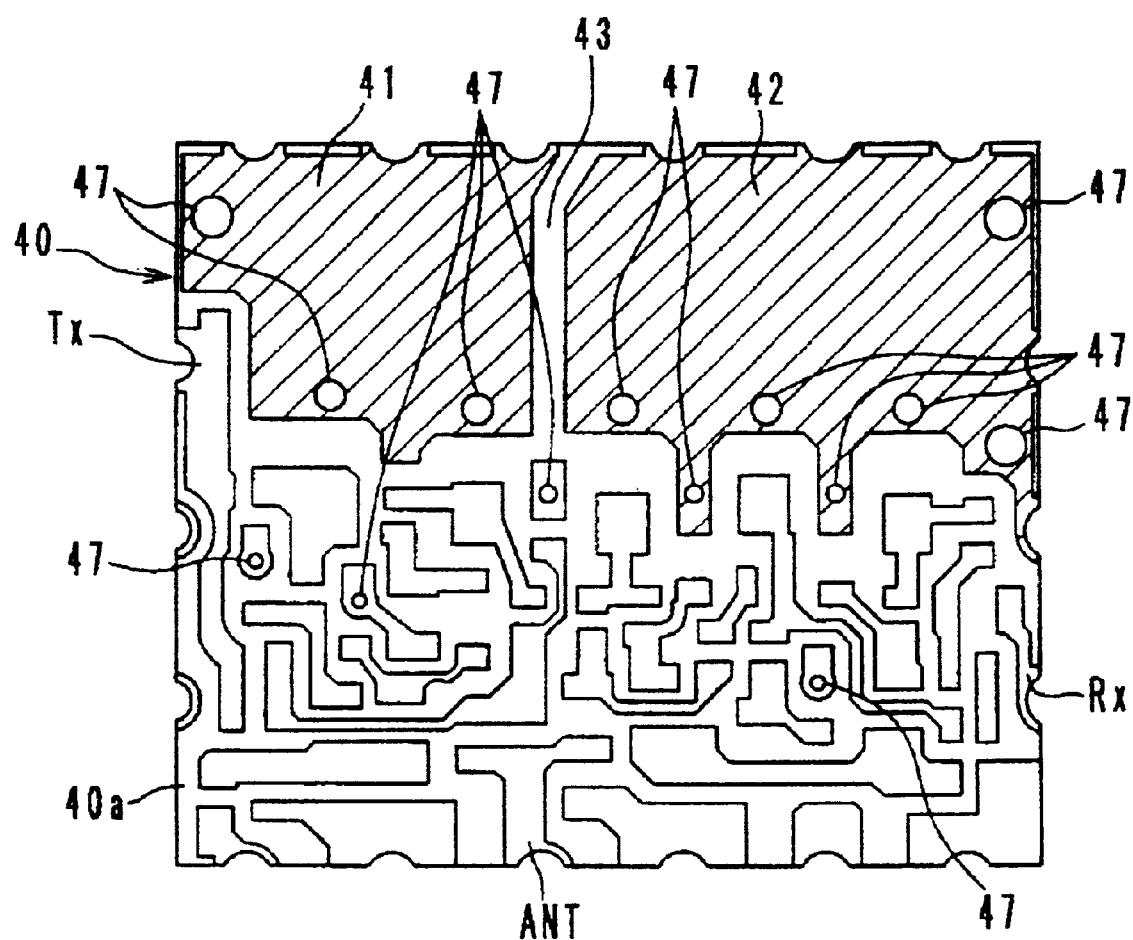
FIG. 10 is a plan view of a circuit substrate for use in the antenna-sharing device shown in FIG. 8, viewed from the resonator-mounting surface side.
Figure 11:
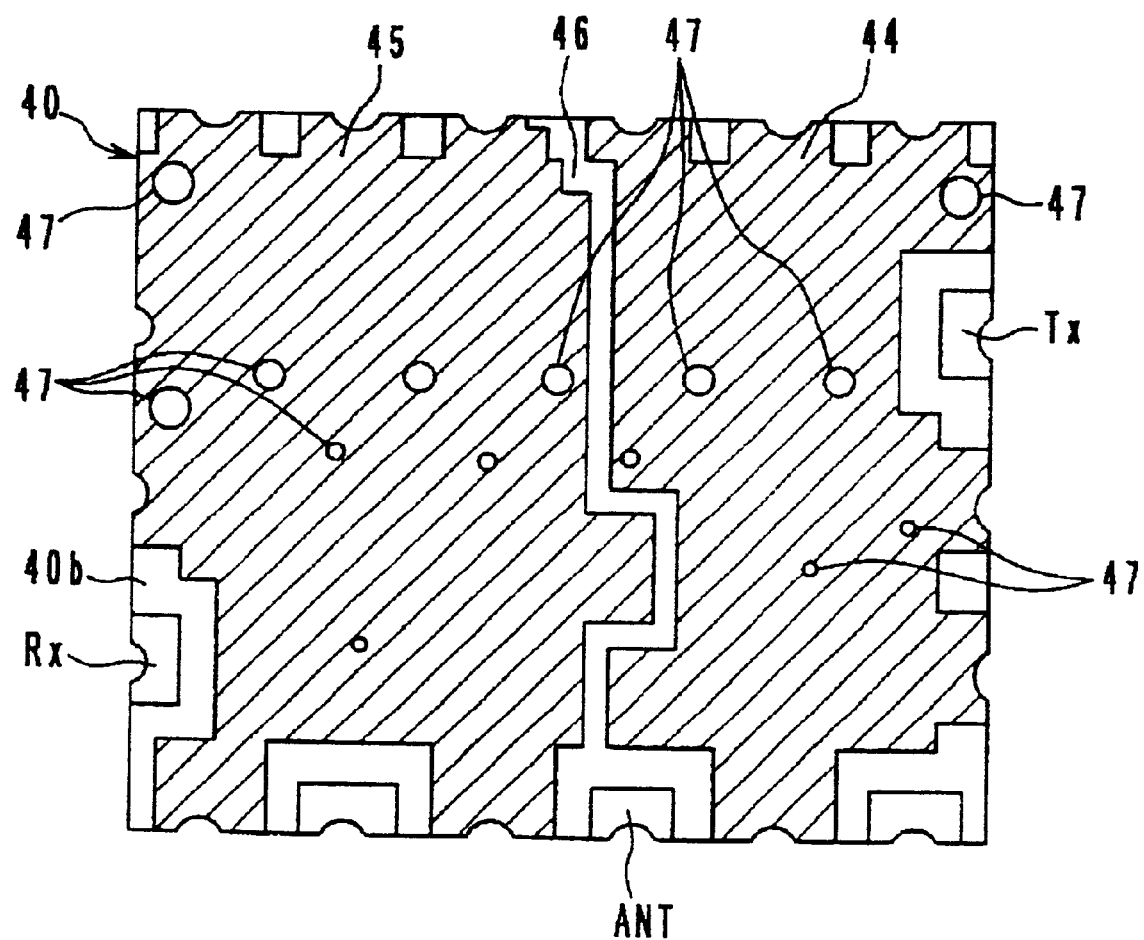
FIG. 11 is a plan view of the circuit substrate for use in the antenna-sharing device shown in FIG. 8, viewed from the mounting-surface side.

The circuit substrate 40 is provided with the transmission terminal Tx, the antenna terminal ANT, and the reception terminal Rx in edge portions thereof, as shown in FIG. 8. The signal pattern, the transmission circuit ground electrode 41, and the reception circuit ground electrode 42 are formed on a resonator-mounting surface 40a (the upper side in FIG. 8) of the circuit substrate 40, as shown in FIG. 10. As shown in FIG. 11, the transmission circuit ground electrode 44 and the reception circuit ground electrode 45 are formed on the mounting surface 40b (the underside in FIG. 8) of the circuit substrate 40. In FIGS. 10 and 11, the ground electrodes 41, 42, 44, and 45 are indicated by sloping lines, and through-holes 47 are shown.

The transmission circuit ground electrode 41 and the reception circuit ground electrode 42 formed on the resonator-mounting surface 40a of the circuit substrate 40 are mutually isolated by a provided gap (slit) 43. The transmission circuit ground electrode 44 and the reception circuit ground electrode 45 formed on the mounting surface 40b of the circuit substrate 40 are mutually isolated by a provided gap (slit) 46 which is partially meandered. The longitudinal directions of the gaps 43 and 46 are set to be parallel to the longitudinal direction of the inner conductors of the dielectric resonators 2 through 6. The gaps 43 and 46 overlap in the position where the transmission circuit 55 and the reception-side circuit 56 are adjacent to each other (more concretely, in the position where the resonators 3 and 4 are adjacent to each other). The transmission circuit ground electrode 41 is electrically connected to the transmission circuit ground electrode 44 by use of the through-holes 47, making the end portions bend onto the end-face of the circuit substrate 40, or the like. The reception circuit ground electrode 42 is electrically connected to the reception ground electrode 45 by use of the through-holes 47, making the end portion thereof bend onto the end-face of the circuit substrate 40, or the like.

Hereinafter, the operation of the antenna-sharing device 39 having the above-described configuration will be described.

The trap frequency of the variable-frequency band-rejection filter circuit 57 in the transmission-side circuit 55 is determined by the respective resonance frequencies of the resonance system comprising the variable-band capacitor C3, the resonance capacitor C1, and the resonator 2, and the resonance system comprising the variable-band capacitor C4, the resonance capacitor C2, and the resonator 3. When a positive voltage is applied as a control voltage to the voltage control terminal CONT1, the PIN diodes D1, D2, and D3 are turned on. Accordingly, the variable-band capacitors C3 and C4 are grounded through the PIN diodes D1, D2, and D3, so that both of the two attenuation pole frequencies are decreased, and the pass-band of the transmission-side circuit 55 is lowered.

In contrast, when a negative voltage is applied as a control voltage, the PIN diodes D1, D2, and D3 are turned off. Instead of applying a negative voltage, the PIN diodes D1 through D3 may be turned off by providing a high impedance of at least 100 kΩ in the control circuit for supplying a control voltage to the voltage control terminal CONT1 so that no voltage is applied to the voltage control terminal CONT1. Thereby, the variable-band capacitors C3 and C4 become open, so that both of the two attenuation pole frequencies are increased, and the pass-band of the transmission-side circuit 55 is enhanced. Thus, the transmission-side circuit 55 can be given two different pass-band characteristics by voltage-controlling the variable-band capacitors C3 and C4 to ground or open.

On the other hand, the pass-frequency of the variable-frequency band-pass filter circuit 58 in the reception-side circuit 56 is determined by the respective resonance frequencies of the resonance system comprising the variable-band capacitor C7, the resonance inductance L9, and the resonator 4, the resonance system comprising the variable-band capacitor C8 and the resonator 5, and the resonance system comprising the variable-band capacitor C9, the resonance inductance L10, and the resonator 6. When a positive voltage as a control voltage is applied to the voltage control terminal CONT2, the PIN diodes D4, D5, and D6 are turned on. Accordingly, the variable-band capacitors 07, 08, and C9 are grounded through the PIN diodes D4, D5, and D6, respectively, and the pass-frequency is decreased. In contrast, when a negative voltage as a control voltage is applied, the PIN diodes D4, D5, and D6 are turned off, and thereby, the variable-band capacitors C7, 08, and C9 become open, and the pass-frequency is increased. Thus, the reception-side circuit 56 can be given two different pass-band characteristics by voltage-controlling the variable-band capacitors C7 through C9 to ground or open.

This variable-frequency band-pass circuit 58 is voltage-controlled so that the band-pass frequency is decreased when the low frequency pass-band is selected as a transmission band, while the band-pass frequency is increased when the high frequency pass-band is selected as a transmission band, in compliance with the switching of the two pass-bands, that is, the high and low pass-bands of the transmission-side circuit 55. Thereby, phase matching with the transmission-side circuit 55 can be ideally carried out.

Further, in the antenna-sharing device 39, the series combination of the two PIN diodes D2 and D3 is connected in series with only the resonator 3 that is electrically connected to the antenna terminal ANT and positioned nearest to the antenna terminal ANT in the transmission-side circuit 55, and moreover, the voltage control terminal CONT1 is connected to the respective anodes of the PIN diodes D2 and D3, so that a high frequency voltage can be divided. Thereby, an intermodulation distortion wave F3 of a transmission wave F1 and a transmission wave F2 from the antenna terminal ANT can be efficiently inhibited.

The transmission circuit ground electrodes 41 and 44 are disconnected from each other, and the reception circuit ground electrodes 42 and 45 are disconnected from each other. Therefore, the ground current of the filter circuit 57 and that of the filter circuit 58 are electrically independent of each other. Accordingly, the ground currents of the filter circuits 57 and 58 do not electromagnetically interfere with each other in the ground electrodes formed on the resonator-mounting surface 40$a$ and the mounting surface 40$b$ of the circuit substrate 40. Thus, electromagnetic coupling between the ground currents of the filter circuits 57 and 58 can be inhibited. As a result, an antenna-sharing device 39 of which the isolation characteristic between the transmission terminal Tx and the reception terminal Rx is excellent can be obtained.

Figure 12:
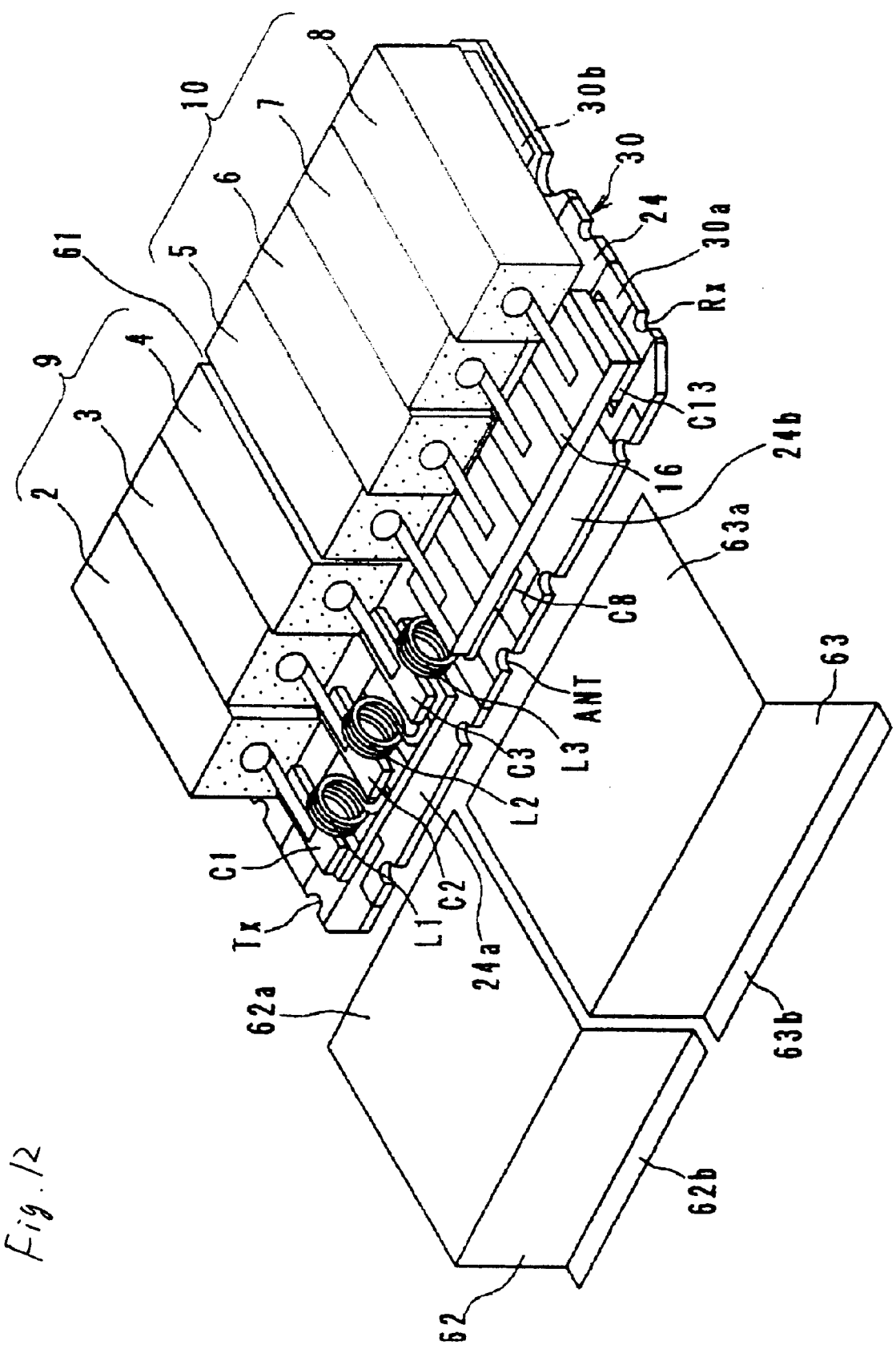
FIG. 12 is a perspective view of an antenna-sharing device according to a third embodiment of the present invention.

Third Embodiment (FIG. 12)

In an antenna-sharing device, electromagnetic coupling between the ground currents of filters can be changed according to the arrangement and sizes of ground electrodes on the circuit substrate, and so forth. Accordingly, in some cases, the electromagnetic coupling between the ground currents of the filters cannot be sufficiently inhibited only by providing a gap for the ground electrodes of the circuit substrate so that the ground electrodes are disconnected from each other, as described in the first and second embodiments. In the case where the dielectric resonators are soldered to each other, and the ground currents of the filters are electromagnetically coupled to each other, the resonators of the transmission filter and those of the reception filter are isolated from each other by providing a gap, so that the electromagnetic coupling of the ground currents of the filters in the ground electrodes can be prevented, and in addition, the electromagnetic coupling of the ground currents, caused by the mutual contact of the filters, can be prevented.

Concretely, for example, in the first embodiment, a gap 61 may be provided between the resonators 2 through 4 of the transmission filter 9 and the resonators 5 through 8 of the reception filter 10, as shown in FIG. 12. The position of the gap 61 overlaps that of the gap (slit) 23 provided between the transmission filter ground electrode 21 and the reception filter ground electrode 22 which are formed on the mounting-surface 30$b$ of the circuit substrate 30, as shown in FIGS. 4 and 5.

Figure 13:
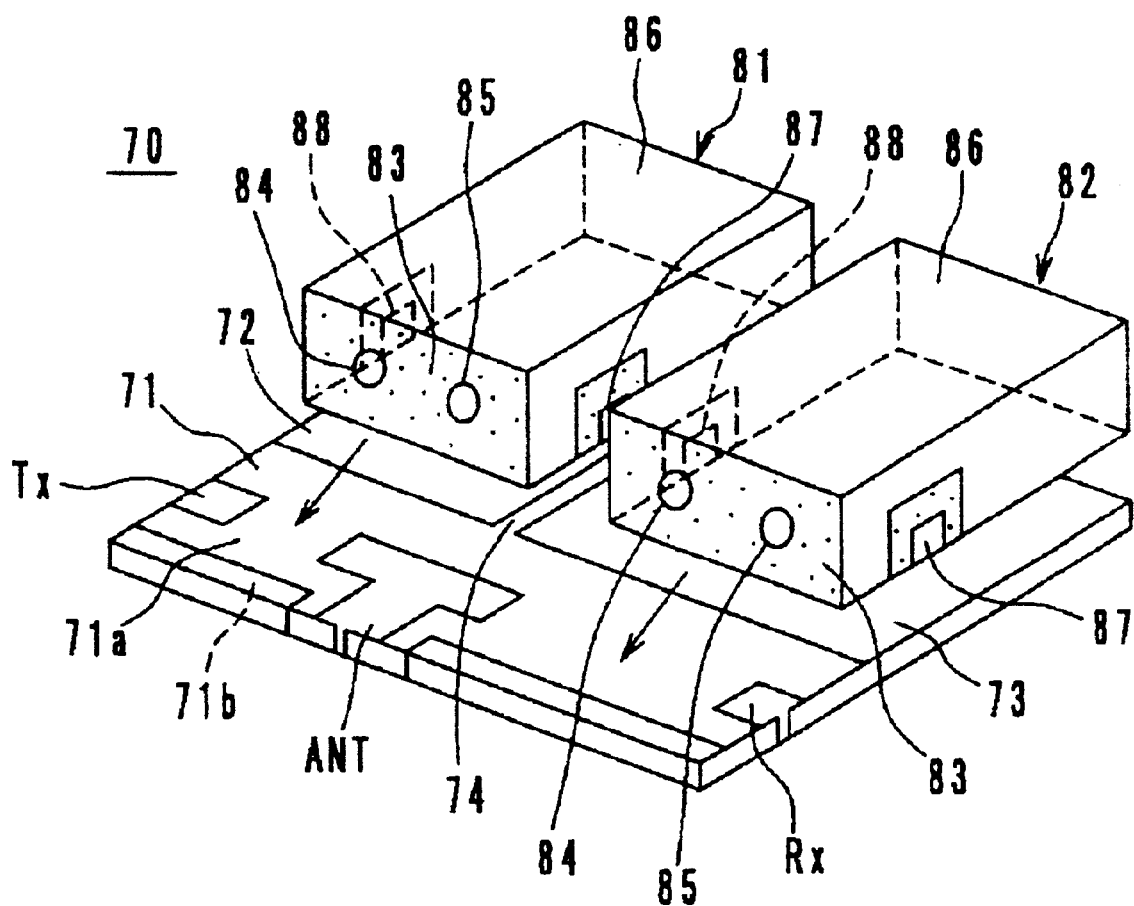
FIG. 13 is a perspective view of an antenna-sharing device according to a fourth embodiment of the present invention.

In addition, a transmission filter shield cover 62 is arranged in opposition to the open-side end-faces of the dielectric resonators 2 through 4 of the transmission filter 9, and a reception filter shield cover 63 is arranged in opposition to the open-side end-faces of the dielectric resonators 5 through 8 of the reception filter 10. The reason is as follows. The dielectric resonators 2 through 8 are sufficiently grounded by means of the shield covers 62 and 63, so that the attenuation outside the pass-band of the antenna-sharing device is assured, and high quality communication can be carried out. For the shield covers 62 and 63, the ends 62$a$ and 63$a$, respectively, are soldered to the outer conductors of the dielectric resonators 2 through 4 and 5 through 8, respectively, and other ends 62$b$ and 63$b$ are soldered to end portions 24$a$ and 24$b$, respectively, of the ground electrode 24 of the circuit substrate 30. A gap is provided between the shield covers 62 and 63. Thus, electromagnetic coupling between the ground currents of the filters 9 and 10 can be more effectively inhibited by electrically connecting the shield covers 62 and 63 to the corresponding filters, independently of each other. Fourth Embodiment (FIG. 13)

In a fourth embodiment, an antenna resonator including an integrated dielectric filter will be described. As shown in FIG. 13, an antenna-sharing device 70 comprises a circuit substrate 71, and integrated-type dielectric filters 81 and 82 mounted onto the circuit substrate 71.

The integrated-type filters 81 and 82 each contain a single dielectric block 83 having a rectangular parallelepiped shape. Penetrating holes 84 and 85 are formed so as to penetrate each block 83 from the front end-face to the back end-face as viewed in FIG. 13. An outer conductor 86 is formed on the outer wall of the dielectric block 83 except for the front end-face thereof viewed in FIG. 13. An inner conductor is formed on each of the inner walls of the penetrating holes 84 and 85. The penetrating holes 84 and 85 and their inner conductors, together with the outer conductor 86 and the dielectric block 83, constitute two dielectric resonators. External terminals 87 and 88 are provided on opposite side-faces of each of the dielectric blocks 83. The dielectric filter 81 is used as a transmission filter, while the dielectric filter 82 is used as a reception filter.

The dielectric filters 81 and 82 having the above-described configuration are disposed on the circuit substrate 71 so that the axial direction of each of the penetrating holes 84 and 85 is parallel to the surface of the circuit substrate 71. At edge portions of the circuit substrate 71, a transmission terminal Tx, an antenna terminal ANT, and a reception terminal Rx are formed. A transmission filter ground electrode 72 and a reception filter ground electrode 73 are formed on a dielectric filter mounting surface 71$a$ (the upper side in FIG. 13) of the circuit substrate 71. A gap (slit) 74 is provided between the transmission filter ground electrode 72 and the reception filter ground electrode 73 so that both are isolated from each other. That is, both are disconnected from each other. The outer conductors 86 of the dielectric filters 81 and 82 are soldered to the ground electrodes 72 and 73, respectively. A gap is provided between the dielectric filters 81 and 82, and the position of this gap overlaps that of the gap 74 between the ground electrodes 72 and 73. Further, though not illustrated in FIG. 13, another transmission filter ground electrode and a reception filter ground electrode, isolated from each other via a gap, are formed on a mounting surface 71$b$ (the underside in FIG. 13) of the circuit substrate 71.

Figure 14:
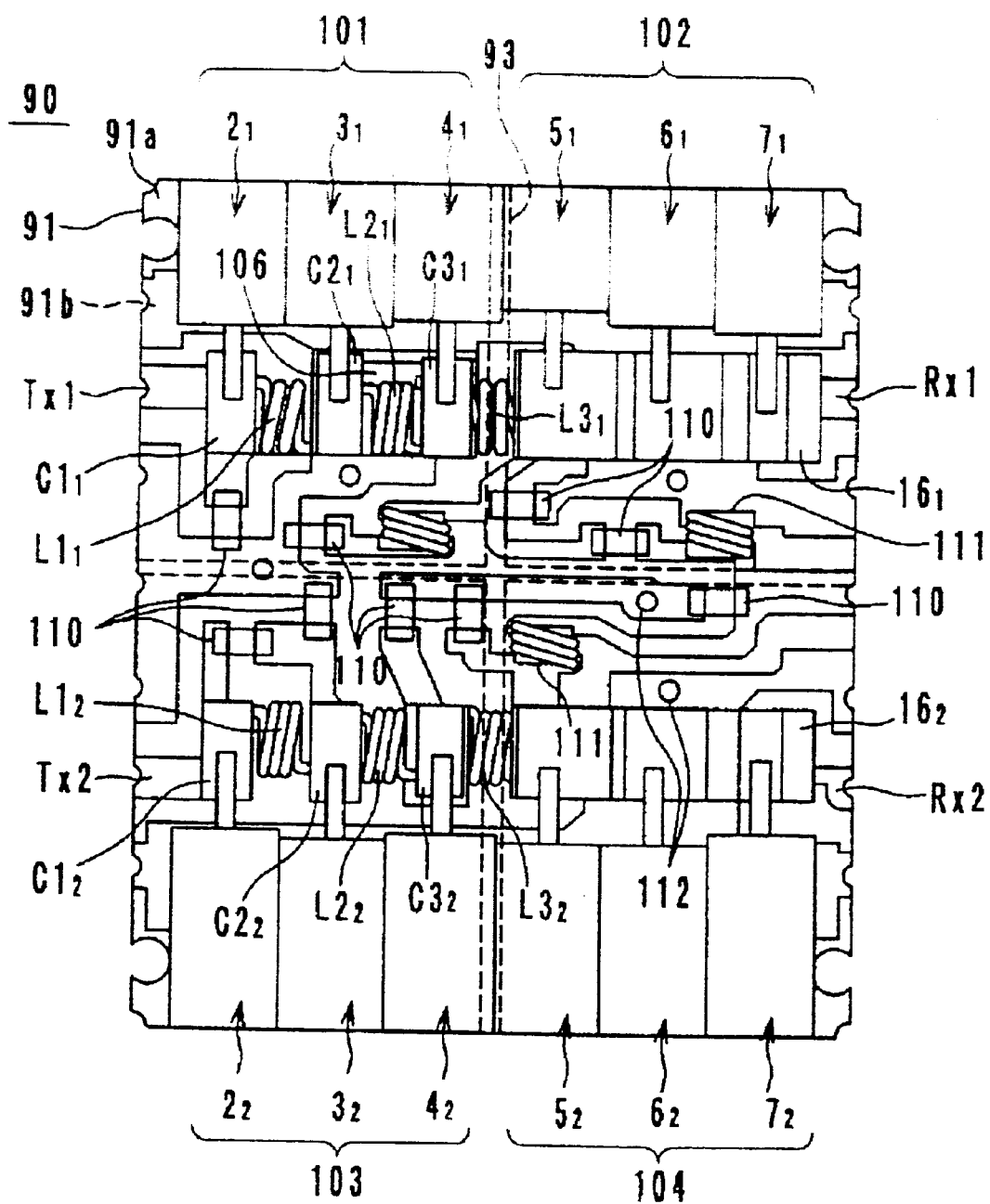
FIG. 14 is a plan view of a high frequency circuit device according to another embodiment of the present invention.

In the antenna-sharing device 70 having the above-described configuration, electromagnetic coupling between the ground currents of the dielectric filters 81 and 82 can be prevented. Fifth Embodiment (FIG. 14)

In a fifth embodiment, a filter device having a dual system including four filters, acting as a high frequency circuit device, will be described. FIG. 14 is a plan view showing a filter device 90 in which each component is mounted onto a resonator-mounting surface 91$a$ of a circuit substrate 91. In the filter device 90, a transmission filter 101 and a reception filter 102 of a first system are electrically connected between a transmission terminal Tx1 and a reception terminal Rx1. A transmission filter 103 and a reception filter 104 of a second system are electrically connected between a transmission terminal Tx2 and a reception terminal Rx2.

The transmission filter 101 includes coaxial dielectric resonators 21, 31, and 4$_1$, capacitors C1$_1$, C2$_1$, and C3$_1$, coils $L1_1$, $L2_1$, and $L3_1$, and a capacitor array substrate 106. The reception filter 102 includes coaxial dielectric resonators $5_1$, $6_1$, and $7_1$, and a capacitor array substrate $16_1$. The transmission filter 103 includes coaxial dielectric resonators $2_2$, $3_2$, and $4_2$, capacitors $C1_2$, $C2_2$, and $C3_2$, and coils $L1_2$, $L2_2$, and $L3_2$. The reception filter 104 includes coaxial dielectric resonators $5_2$, $6_2$, and $7_2$, and a capacitor array substrate $16_2$. Further, in FIG. 14, chip capacitors 110, coils 111, and through-holes 112 are shown.

On a mounting face 91b of the circuit substrate 91, a transmission filter ground electrode and a reception filter ground electrode of the first system and a transmission filter ground electrode and a reception filter ground electrode of the second system are formed, though they not illustrated. The respective ground electrodes are mutually isolated by a cross-shaped gap (slit) 93, and are disconnected from each other.

In the filter device 90 having the above-described configuration, electromagnetic coupling between the ground currents of the filters 101 through 104 can be prevented.

Figure 15:
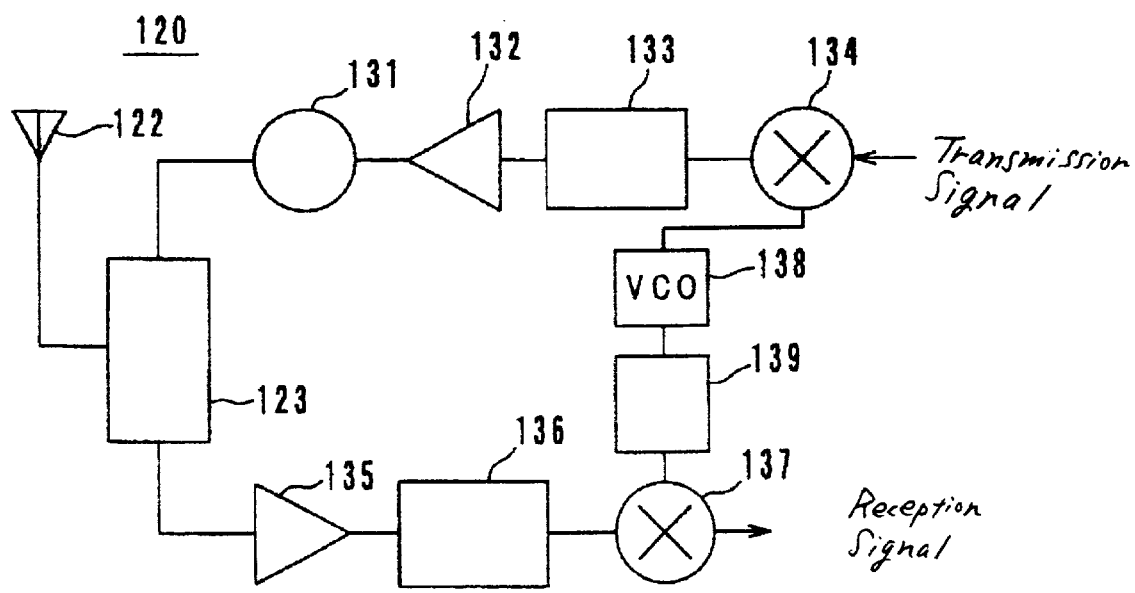
FIG. 15 is a block diagram of a communication apparatus according to another embodiment of the present invention.

Sixth Embodiment (FIG. 15)

In a sixth embodiment, an example of a communication apparatus according to the present invention is described. In this embodiment, a portable telephone is described as an example. FIG. 15 is an electrical circuit block diagram showing an RF section-of a portable telephone 120. An antenna component 122, a duplexer 123, a transmission-side isolator 131, a transmission-side amplifier 132, a transmission-side interstage band-pass filter 133, a transmission-side mixer 134, a reception-side amplifier 135, a reception-side interstage band-pass filter 136, a reception-side mixer 137, a voltage-controlled oscillator (VCO) 138, and a local band-pass filter 139 are shown in FIG. 15.

Figure 16:
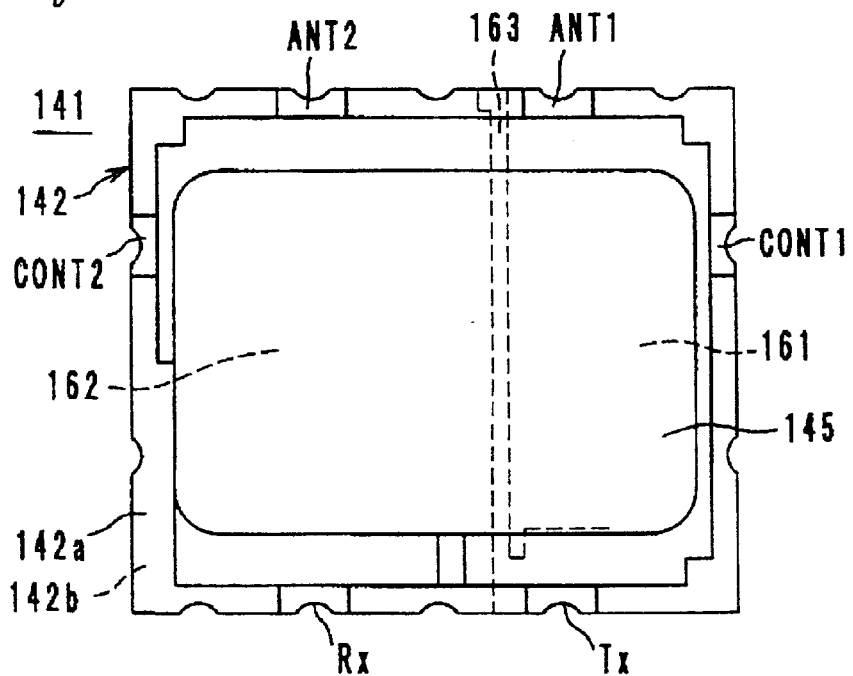
FIG. 16 is a plan view of a high frequency circuit device according to a further embodiment of the present invention.
Figure 17:
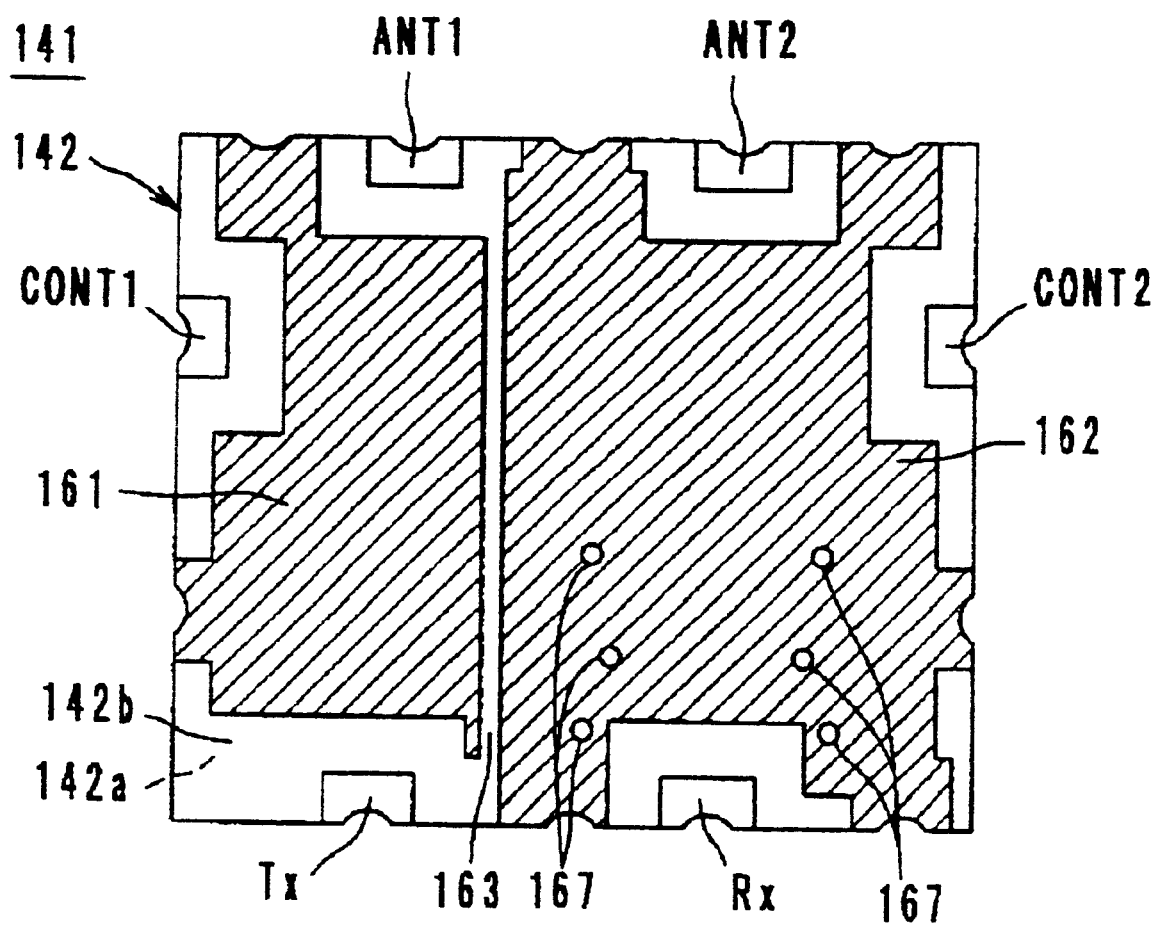
FIG. 17 is a plan view of a circuit substrate for use in the high frequency circuit device shown in FIG. 16, viewed from the mounting-surface side.

As the duplexer 123, the antenna-sharing devices 1, 39, and 70 of the above-described first, second, and fourth embodiments, respectively, and the filter device 90 of the fifth embodiment may be used. Portable telephones having excellent isolation characteristics can be realized by mounting these antenna-sharing devices 1, 39, and 70, and the filter device 90. Seventh Embodiment (FIGS. 16 through 18)

In a seventh embodiment, as an example of a high frequency circuit device, an RF diode switch corresponding to antenna diversity is described. FIG. 16 is a plan view of an antenna switch 141 showing the state in which a composite circuit component 145 containing a transmission-terminal circuit 155 and a reception-terminal circuit 156 (described later) is mounted onto a circuit substrate 142. FIG. 17 is an illustration of the antenna switch 141 viewed from a mounting-face side thereof. In general, the antenna switch 141 is used to switch from a transmission circuit to a reception circuit and vice versa in a digital portable telephone or the like.

Figure 18:
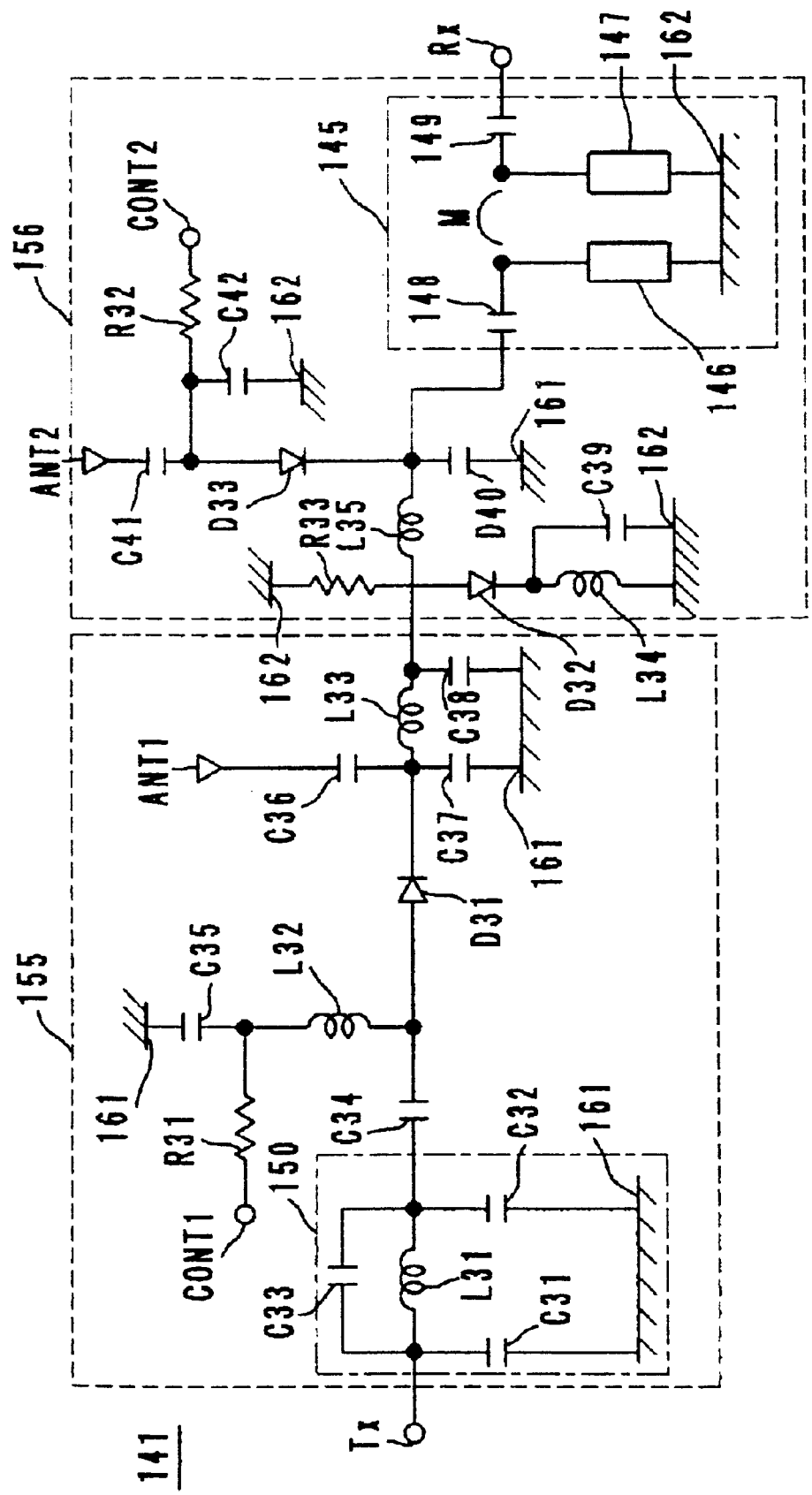
FIG. 18 is an electrical circuit diagram of the high frequency circuit device shown in FIG. 16.

FIG. 18 is an electrical circuit diagram of the antenna switch 141. The transmission-terminal circuit 155 and the reception-terminal circuit 156 are connected between a transmission terminal Tx and a reception terminal Rx. To the transmission terminal Tx, the anode of a diode D31, which is a switching component, is connected through a tertiary low-pass filter 150 and a coupling capacitor C34. The tertiary low-pass filter 150 comprises a coil L31 and capacitors C31 through C33. The anode of the diode D31 is grounded through a series circuit comprising a coil L32 and a capacitor C35. To an intermediate point between the coil L32 and the capacitor C35, a voltage control terminal CONT1 is connected through a resistor R31. To the voltage control terminal CONT1, a control circuit is connected for switching the transmission path of the antenna switch 141.

Further, the cathode of the diode D31 is connected to an antenna terminal ANT1 through a capacitor C36.

The anode of the diode D32, which is a switching component, is connected to the antenna terminal ANT1 through a capacitor C36, a coil L33, and to the ground via capacitors C37, 38. The cathode of a diode D32 is grounded through a parallel circuit comprising a coil L34 and a capacitor C39. The anode of the diode D32 is connected through a coil L35 to a reception filter 145 and the cathode of a diode D33, which is a switching element. As the reception filter 145, the same filter as the integrated-type dielectric filter 82 shown in FIG. 13 is used. A capacitor 149 is a static capacitance formed between the external terminal 88 and the outer conductor 86. Resonators 146 and 147 are the dielectric resonators constituted of the penetrating holes 84 and 85, their inner conductors, outer conductors 86, and dielectric blocks 83.

The anode of the diode D33 is connected to an antenna terminal ANT2 through a capacitor C41. To an intermediate point between the diode D33 and the capacitor C41, a voltage control terminal CONT2 is connected through a resistor R32. To the voltage control terminal CONT2, a control circuit is connected for switching the transmission path of the antenna switch 141. Further, a resistor R33 is connected between the anode of the diode D33 and the ground, a capacitor C40 is connected between the cathode of the diode D33 and the ground, and a capacitor C42 is connected between the anode of the diode D33 and the ground.

In the circuit substrate 142, the transmission terminal Tx, the antenna terminals ANT1 and ANT2, the reception terminal Rx, and the voltage control terminals CONT1 and CONT2 are formed, as shown in FIGS. 16 and 17. The signal pattern and the ground electrodes are formed on a component-mounting surface 142a of the circuit substrate 142, as shown in FIG. 16. On the other hand, as shown in FIG. 17, a transmission-terminal circuit ground electrode 161 and a reception-terminal circuit ground electrode 162 (shown by sloping lines) are formed on a mounting surface 142b of the circuit substrate 142. Further, the transmission-terminal circuit ground electrode 161 and the reception-terminal circuit ground electrode 162 are isolated from each other by providing a gap (slit) 163. That is, the ground electrode formed on the component-mounting surface 142a of the circuit substrate 142 is common to the transmission-terminal circuit 155 and the reception-terminal circuit 156, while the ground electrodes 161 and 162 formed on the mounting face 142b are used exclusively for the transmission-terminal circuit 155 and the reception-terminal circuit 156, respectively. Further, through-holes 167 are shown in FIG. 17.

In the antenna switch 141 having the above-configuration, the diodes D31 through D33 can be turned on or off so that the transmission path can be switched by applying a positive potential or a ground potential (or a negative potential) to the voltage control terminals CONT1 and CONT2. The transmission-terminal circuit ground electrode 161 and the reception-terminal circuit ground electrode 162 are disconnected from each other. Therefore, the ground current of the transmission-terminal circuit 155 and that of the reception-terminal circuit 156 are electrically independent of each other in the mounting-surface 142b of the circuit substrate 142. Accordingly, the ground currents of the transmission-terminal circuit 155 and the reception-terminal circuit 156 do not electromagnetically interfere with each other in the ground electrodes 161 and 162 on the mounting face 142b of the circuit substrate 142. Thus, electromagnetic coupling between the ground currents of the transmission-terminal circuit 155 and the reception-terminal circuit 156 can be inhibited. As a result, the antenna switch 141 having an excellent isolation characteristic between the transmission terminal Tx and the reception terminal Rx can be provided.

Other Embodiments

The high frequency circuit device, the antenna-sharing device, and the communication apparatus according to the present invention are not limited to the above-described embodiments, and can be modified without departing from the scope of the present invention. The high frequency device may be a power amplifier, a low noise amplifier, a voltage controlled oscillator, or the like, in addition to the antenna-sharing device, the filter device, and the antenna switch described above. The resonator may be a microstrip line resonator, an LC resonance circuit in which an inductance component and a capacitance component are combined, or the like, in addition to the dielectric resonator.

In the above-described embodiments, the mutual isolation of the ground electrodes is carried out by use of the gap provided parallel to the surface of the circuit substrate. However, the ground electrodes may be isolated from each other in the vertical direction by forming an insulator film on the surface of a ground electrode, and forming another ground electrode on the insulator film.

As seen in the above description, according to the present invention, the ground electrodes of the plurality of high frequency circuits formed on one circuit substrate are disconnected from each other. Therefore, the ground currents of the respective high frequency circuits are prevented from electromagnetically interfering with each other in the ground electrodes, and electromagnetic coupling between the ground currents of the high frequency circuits can be inhibited. As a result, a high frequency circuit device and an antenna-sharing device each having an excellent isolation characteristic can be obtained.

Preferably, a gap is provided between the high frequency circuits adjacent to each other, electronic components constituting the high frequency circuits are mounted onto the circuit substrate, and the position of the gap provided between the ground electrodes overlaps that of the gap provided between the high frequency circuits. Thereby, electromagnetic coupling between the ground currents of the high frequency circuits on the ground electrodes can be prevented, which is caused when the electronic components constituting the high frequency circuits come into contact with each other, and in addition, electromagnetic coupling between the ground currents of the high frequency circuits is prevented from occurring in the ground electrodes.

Also, preferably, shield covers are provided corresponding to the plurality of high frequency circuits, and the shield covers are electrically connected to the corresponding ground electrodes independently of each other. Thereby, electromagnetic coupling between the ground currents of the high frequency circuits in the ground electrodes can be prevented more effectively.

When the high frequency circuit device is built in practice in an electronic device such as a portable telephone or the like, the grounding is sometimes insufficient depending on the shape and size of the ground electrode of a printed circuit board to which the high frequency device is mounted. In this case, sufficient grounding can be achieved by making predetermined portions of the plurality of ground electrodes conduct electrically by an electrically-connecting part.

While the invention has been particularly shown and described with reference to preferred embodiments thereof, it will be understood by those skilled in the art that the forgoing and other changes in form and details may be made therein without departing from the spirit of the invention.

What is claimed is:

1. An antenna-sharing device, comprising:

a circuit board having opposed upper and lower surfaces;

a transmission filter disposed on the upper surface and comprising a first resonance circuit;

a reception filter disposed on the upper surface adjacent the transmission filter and comprising a second resonance circuit; and first and second ground electrodes formed on the lower surface and being spaced apart by an intervening gap so as to be physically separated from one another, the transmission and reception filters being electrically connected to the first and second ground electrodes, respectively.

2. The antenna-sharing device according to claim 1, wherein the first and second ground electrodes are electrically isolated from one another.

3. The antenna-sharing device according to claim 2, further including first and second shield covers for the transmission and reception filters, respectively, the first and second shield covers being connected to the first and second ground electrodes, respectively.

4. The antenna-sharing device according to claim 1, wherein the transmission filter is connected between a transmission terminal and a common antenna terminal and the reception filter is connected between a reception terminal and the common antenna terminal.

5. The antenna-sharing device according to claim 1, further including first and second shield covers for the transmission and reception filters, respectively, the first and second shield covers being connected to the first and second ground electrodes, respectively.

6. The antenna-sharing device according to claim 1, wherein at least one of the first and second resonance circuits comprises a coaxial dielectric filter.

7. The antenna-sharing device according to claim 1, wherein at least one of the first and second resonance circuits comprises an integrated dielectric filter.

8. The antenna-sharing device according to claim 1, wherein at least one of the first and second resonance circuits comprises a variable-frequency dielectric filter.

9. A communication apparatus comprising the antenna-sharing device according to any one of claims 1–8.

* * * * *